(12) United States Patent
Sotiriou et al.

(10) Patent No.: US 7,603,635 B2
(45) Date of Patent: Oct. 13, 2009

(54) ASYNCHRONOUS, MULTI-RAIL DIGITAL CIRCUIT WITH GATING AND GATED SUB-CIRCUITS AND METHOD FOR DESIGNING THE SAME

(75) Inventors: Christos P. Sotiriou, Crete (GR); Pavlos Mattheakis, Crete (GR)

(73) Assignee: Institute of Computer Science (ICS) of the Foundation for Research & Technology Hellas, Foundation for Research and Technology Hellas (Forth), Heraklion, Crete (GR)

(*) Notice: Subject to any disclaimer, the term of this patent is extended or adjusted under 35 U.S.C. 154(b) by 105 days.

(21) Appl. No.: 11/831,942

(22) Filed: Jul. 31, 2007

(65) Prior Publication Data
US 2009/0037853 A1    Feb. 5, 2009

(51) Int. Cl.
*G06F 17/50* (2006.01)
*H03K 17/00* (2006.01)

(52) U.S. Cl. ................. 716/1; 716/3; 327/385
(58) Field of Classification Search ............... None
See application file for complete search history.

(56) References Cited

U.S. PATENT DOCUMENTS

| | | | |
|---|---|---|---|
| 4,686,392 A | 8/1987 | Lo | |
| 5,305,463 A | 4/1994 | Fant et al. | |
| 6,526,542 B2 | 2/2003 | Kondratyev | |
| 6,557,161 B2 | 4/2003 | Jones | |
| 2006/0190852 A1* | 8/2006 | Sotiriou | .................. 716/3 |
| 2007/0124686 A1 | 5/2007 | Ramani | |

OTHER PUBLICATIONS

International Search Report and Written Opinion for International Application No. PCT/US08/68235, mailed on Sep. 16, 2008, 7 pages.
Vivek Tiwari et al. "Guarded Evaluation: Pushing Power Management to Logic Synthesis/Design" IEEE Transactions on Computer-Aided Design Journal (TCAD), 1996, 21 pages.
J. Cortadella et al. "Coping with the Variability of Combination Logic Delays" Proceedings of the International Conference on Circuit Design (ICCD), Oct. 2004, 6 pages.

* cited by examiner

*Primary Examiner*—Leigh Marie Garbowski
(74) *Attorney, Agent, or Firm*—Cooley Godward Kronish LLP

(57) ABSTRACT

A computer readable storage medium includes executable instructions to analyze an asynchronous, multi-rail digital circuit to identify a gating sub-circuit and a gated sub-circuit. The asynchronous, multi-rail digital circuit is transformed to segregate the gating sub-circuit and the gated sub-circuit.

19 Claims, 7 Drawing Sheets

ASYNCHRONOUS, MULTI-RAIL DIGITAL CIRCUIT WITH GATING AND GATED SUB-CIRCUITS AND METHOD FOR DESIGNING THE SAME

BRIEF DESCRIPTION OF THE INVENTION

The present invention relates generally to digital circuits. More particularly, the invention is directed to an asynchronous, multi-rail gated circuit with gating and gated sub-circuits and a method for designing the circuit.

BACKGROUND OF THE INVENTION

An asynchronous circuit is a sequential digital circuit that operates without a global clock signal. Instead, an asynchronous circuit has autonomous components that are triggered by signals that indicate the completion of operations.

A multi-rail asynchronous circuit encodes data and spacer values using two or more signal rails. In such encodings, the data value represents actual binary data fed to the circuit, for example, a TRUE or a FALSE value. The spacer value is used to initialize the circuit to prepare it for accepting the next data value.

Multi-rail asynchronous circuits operate in two phases, alternating between data and spacer values. In the first phase, data values are applied at circuit inputs and data values appear at circuit outputs. The second phase is triggered by the completion of the first phase. In the second phase, spacer values are applied at circuit inputs. The second phase is completed when the spacer values have propagated to the outputs. Both phases operate by feeding the value (data or spacer) at the circuit inputs and waiting for that value to propagate through the circuit to the outputs.

The most common encoding type in asynchronous, multi-rail logic is dual-rail encoding. In dual-rail encoding, a digital signal is represented by two binary rails, which assume a total of four states, (0, 0), (0, 1), (1, 0) and (1, 1). In one scheme, the (0, 0) value represents the spacer word, the (0, 1) value represents the TRUE data value, whereas the (1, 0) value represents the FALSE data value. The value (1, 1) is commonly unused, except in a scheme where both positive level and negative level signals are supported.

A reason for encoding digital signals in multi-rail representations is to enable the detection of the propagation of data values from the circuit inputs to the circuit outputs. A completion mechanism detects that the operation of the circuit has completed. Circuits designed using multi-rail representations can thus exhibit asynchronous, data-dependent input to output delays. These types of circuits can increase the performance of digital systems by replacing the conventional synchronous, combinational logic circuits, the operation of which is based on an external timing reference, i.e. a clock signal. The period of the clock signal is determined by the so-called critical path, which represents an input to output path, which may be triggered by a real input vector that exhibits the largest possible delay.

Detecting completion requires a specific mechanism to be added to the multi-rail circuit, the operation of which depends on the circuit implementation of the multi-rail logic. There are two known completion schemes, namely, "strongly-indicating" and "weakly-indicating". "Strongly-indicating" circuits only propagate data values at the outputs after all internal nodes have settled to their final values. "Weakly-indicating" circuit propagate data values at the outputs even if some of the internal nets have not yet assumed their final values. Spacer values are propagated in both types identically.

The majority of digital designs today are implemented using synchronous techniques, requiring the presence of external clock signals. The key advantage of asynchronous circuits is the possibility to exploit data-dependent, true, input-to-output delay indicated by the circuit itself. Asynchronous circuits have the potential for increasing performance and are immune to parametric and environmental variations, such as temperature variations, power supply voltage fluctuations and variability in fabrication characteristics of on-chip devices.

Multi-rail asynchronous circuits are known. Unfortunately, multi-rail asynchronous circuits have relatively high dynamic power consumption due to the combination of the two-phase operation discipline and the multi-rail encoding, which introduces redundancy, i.e., in a dual-rail architecture, the false nodes generate the opposite value of the true ones, thus more signal transitions are added. A circuit is monotonic when its mode of operation guarantees that for every operation of the circuit, all of the signal transitions are always unidirectional, not necessarily in the same direction, e.g., some are rising, others falling, but always in a predetermined way. This mode of operation is termed monotonic. Advantageously, such a circuit is free of signal glitches or hazards. On the other hand, the two phase operation implies that on average 50% of the circuit nodes switch value while processing data or a spacer word. Therefore, it would be desirable to reduce the power consumption associated with such circuits. That is, it would be desirable to reduce the power consumption associated with asynchronous, multi-rail circuits.

SUMMARY OF THE INVENTION

The invention includes a computer readable storage medium with executable instructions to analyze an asynchronous, multi-rail digital circuit to identify a gating sub-circuit and a gated sub-circuit. The asynchronous, multi-rail digital circuit is transformed to segregate the gating sub-circuit and the gated sub-circuit.

The invention also includes a circuit with a segregated gating circuit and a segregated gated circuit that form an asynchronous, multi-rail digital circuit. The gating circuit operates initially to determine if the output of the gaiting circuit is sufficient to determine a final value.

The invention transforms an initial multi-rail, monotonic asynchronous circuit to a logically equivalent circuit with gating signals. The gating signals save power by reducing the number of signal transitions. Gating signals have been used in non-monotonic circuits, but have not produced significant power savings because of the logic hazards and the power overhead of the gating structures, which tend to cancel out the benefits of gating. Non-monotonic circuits store state while gating, whereas monotonic circuits do not, because of their two-phase operation. Thus, the gating approach of the invention is stateless, unlike prior art gating techniques. Consequently, gating can be implemented with stateless gates.

Two-phase monotonic circuits are restructured with logic gates and/or gating latches in accordance with the invention. The invention includes techniques for identifying gated and gating parts in monotonic circuits. The hazard-free nature and two-phase operation of the restructured circuits result in significant power savings. For example, a 20% overhead in gating structure leads to 20% power reduction, thus the invention establishes a linear area-power dependence.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
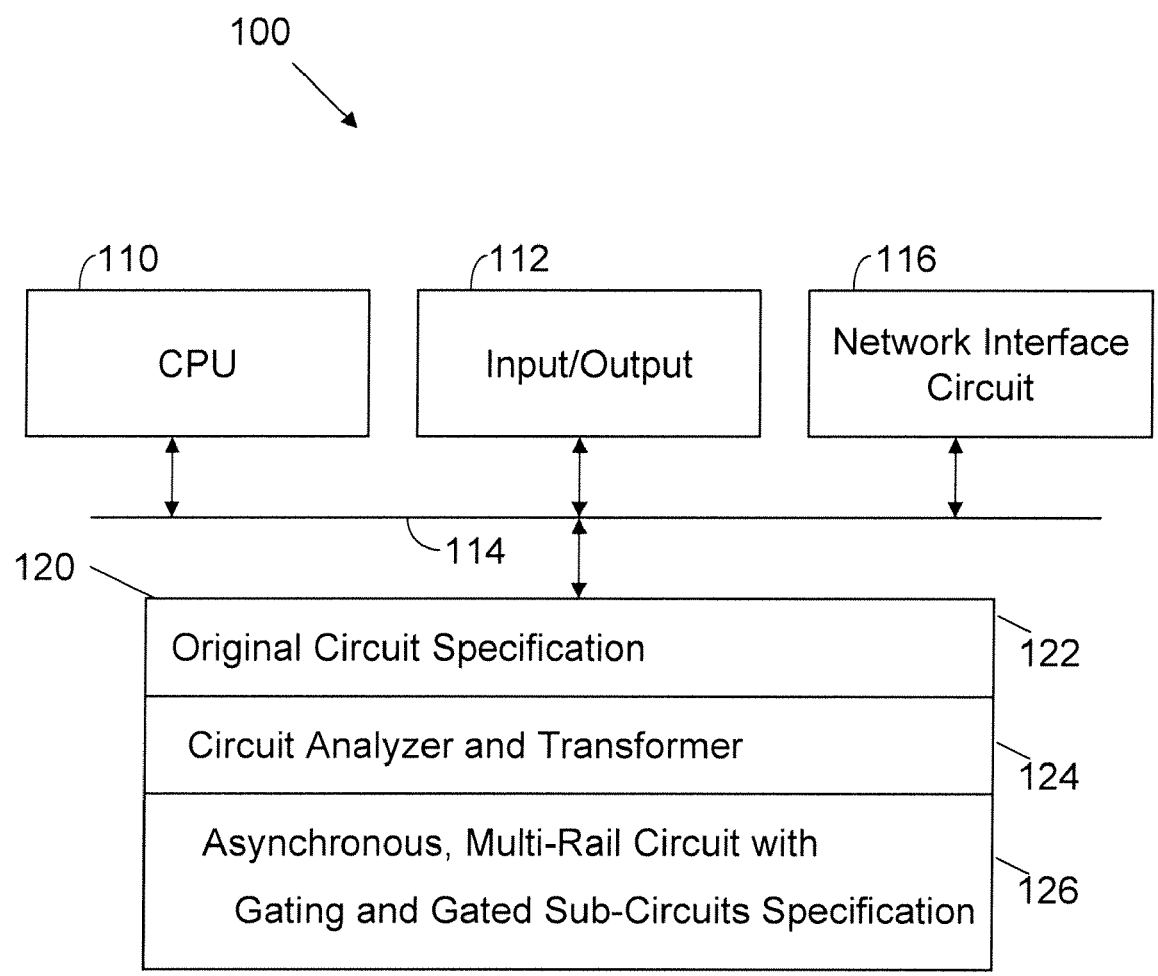
FIG. 1 illustrates a computer configured in accordance with an embodiment of the invention.

FIG. 1 illustrates a computer 100 configured in accordance with an embodiment of the invention. The computer 100 includes standard components, such as a central processing unit 110 and input/output devices 112 connected via a bus 114. The input/output devices 112 may include a keyboard, mouse, display, printer, and the like. A network interface circuit 116 is also connected to the bus 114. The network interface circuit 116 provides connectivity to a network (not shown). Thus, the computer 100 may operate in a stand-alone mode or in a client-server configuration.

A memory 120 is also connected to the bus 114. The memory stores data and executable instructions to implement operations of the invention. For example, the memory 120 stores an original circuit specification, such as a Boolean design or a netlist. The original circuit specification is processed by the circuit analyzer and transformer module 124, which implements operations of the invention. The output of the circuit analyzer and transformer module 124 is a specification for an asynchronous, multi-rail circuit with gating and gated sub-circuits 126. The specification may then be used to fabricate the circuit using standard techniques.

Figure 2:
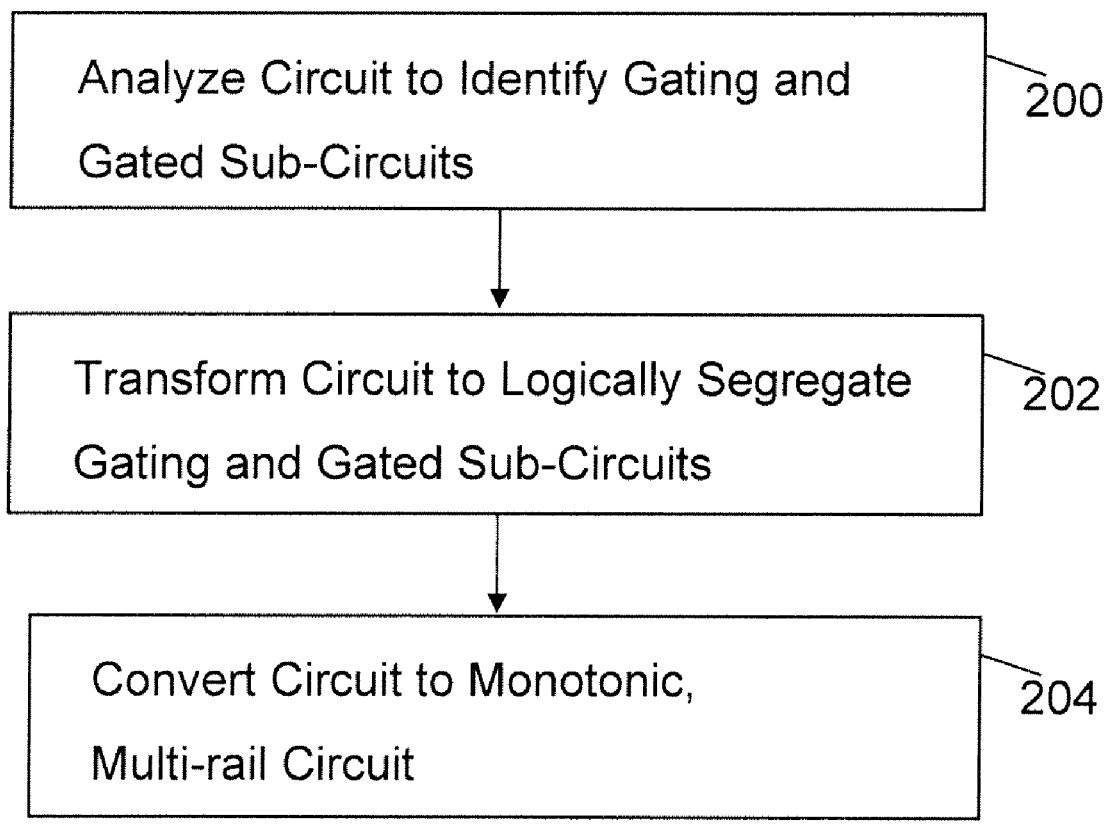
FIG. 2 illustrates processing operations associated with an embodiment of the invention.

FIG. 2 illustrates processing operations associated with an embodiment of the circuit analyzer and transformer 124. A circuit is initially analyzed to identify gating and gated sub-circuits 200. The circuit is then transformed to logically segregate gating and gated sub-circuits 202. The circuit is then converted to a monotonic, multi-rail circuit 204. This operation may be performed first (i.e., prior to operation 200).

Thus, the invention includes a method of converting an initial monotonic, multi-rail circuit into a gated equivalent. That is, an equivalent circuit with gating signals. The initial multi-rail circuit is analyzed in accordance with criteria to enumerate, select and analyze candidate gating and gated sub-circuits or cones. The criteria may include several parameters, such as area overhead, gating possibility or timing. Gating possibility is the possibility that the gating sub-circuit will evaluate to a controlling value, i.e., determines the value of the controlled cone. The technique identifies and outputs the most appropriate gating and gated circuit subparts. The circuit is then restructured by inserting gating signals and gating latches, which impose a signal evaluation hierarchy. The evaluation hierarchy specifies gating signals that evaluate first while latches remain closed. If the gating outputs are insufficient for determining the final value of a given logic cone, the gated part evaluates by opening its latches. Thus, the invention saves power by guarding the evaluation of the gated cones until the gating cones have evaluated. Then, based on the outcome of the gating cones, some or all of the gated cones may not need to evaluate and thus power is reduced. In this context, the gated cones remain in the NULL or RESET phase, perhaps for several cycles, thereby reducing power.

The gating sub-circuits or cones are monotonic Boolean functions. Gating cones may be implemented using the same multi-rail method used to detect whether other cones, such as gated cones, will be allowed to evaluate their outputs. The gating cones evaluate during every DATA and NULL phase according to their multi-rail (e.g., dual-rail) inputs. The inputs of gating cones may be a subset of primary inputs (PI) or the outcome of controlled cones. Gating cones do not contain any gated signals. Each gating cone controls at least one gated cone. In practice, based on the Boolean specification, a gating cone may control several gated cones, e.g. 2 or 3. Each gated cone is associated with a gating cone. Gating cones of the invention are a function of the multi-rail encoding and two-phase discipline of asynchronous multi-rail circuits.

Gated cones are monotonic Boolean functions that are dependent on gating cones. Each gated cone is associated with a single gating cone, and the former is not allowed to evaluate until the gating cone has evaluated and reached a decision. The decision of the gating cone determines whether the gated cone needs to evaluate, or its output value is not needed to compute the final outcome of the controlled cone. In this way, in many cases during the circuit's operation the gated cone will not need to be evaluated, thus saving on signal transitions and power. Their inputs are "guarded" or "gated", i.e., reside at NULL until it is known by the outcome of their gating counterparts whether their evaluation is necessary.

Controlled cones are monotonic Boolean function cones that are structured to be functions of gating and gated cones and potentially some additional inputs. A controlled cone, labeled as (gating, gated), can assume its value from either the gating function alone (when the gating function evaluates to a controlling value, described below), in the specific case where the gated function's value is not necessary, or (when the gating function evaluates to a non-controlling value) from both the combination of the gated function and any additional inputs. The controlled cones of the invention secure power savings.

Guarding gates or guarding latches are stateless gates (typically AND gates) or level-sensitive latches that are used to "guard" or "gate" the inputs of gated cones, i.e., hold them in their NULL state. Thus, the circuit analyzer and transformer 124 converts a set of Boolean equations to a gated monotonic Boolean circuit with gating cones, gated cones and stateless gates.

A controlled cone is either a fully-controllable function, whereby each of its variables can determine the function's result, or a semi-controllable function, in which only some of its variables can determine the function's result. An example of a fully-controllable function is the logical AND function. If any of an AND function's inputs evaluate to Logic 0, then the AND function itself will evaluate to Logic 0, independently of the other variables' values.

An example of a semi-controllable function is the OA (OR-AND) function. For an OA function, $f=(a+b+c)*d$, where, for this example, only variable d can determine f's result without the evaluation of any of the other variables, a, b and c.

A monotonically-increasing node containing an AND/NOR operator, the operands of which can totally control the outputs of the given node (the inputs may themselves be PIs or functions in the circuit), is suitable for implementation as a controlled cone, where all of the AND/NOR operands, with controlling property, are gating candidates. As an example, consider three functions, f, g and h, as follows:

$$f=g.h=(g+h)' \qquad (eq. 1)$$

$$g=a+b+c \qquad (eq. 2)$$

$$h=d \qquad (eq. 3)$$

In this example, both g and h are suitable gating candidates for f, as they are signals, or logic cones, which fully control the outcome of f.

Monotonically increasing nodes with AND/NOR operands have significant potential for power savings since they hold their corresponding gated cones constantly at Logic 0 during consecutive NULL and DATA phases. During a DATA phase, a gating function evaluates to Logic 1, in which case, the evaluation of the gated part determines the function's output. The opposite is the case for monotonically-decreasing nodes.

Thus, when focusing on power savings, the direction of monotonicity (increasing or decreasing) for a node determines the controlled cone function selection:

for a monotonically-increasing circuit node, internal AND or NOR operators are appropriate controlled cones; and for a monotonically-decreasing circuit node, internal OR or NAND operators are appropriate controlled cones.

Gating and gated logic cones stem from the derivation of controlled cones. Once the fully-controllable or semi-controllable function of a controlled cone is determined, its operands may serve as either gating or gated logic cones. Classifying a function's operand as either a gating cone or a gated cone depends on four factors, with respect to the effectiveness of the power savings of the resulting circuit:

1. necessity of every controlled function to have at least one gating cone;

2. logic depth from the primary inputs;

3. implementation complexity of the cone (expressed as the number of its literals); and 4. choice between classifying a given function operand into either the gated or the gating set; in this case, for maximizing power savings it is preferable to include the cone in the gated set, unless no gating cone (factor 1) holds.

Attention now turns to gating transformations utilized in accordance with an embodiment of the invention. Consider the following gated cone computation.

```
1.  Gated_Logic_Cone(C, n) {      // C:Gated Logic cone, n:node //
2.      For all c in Fanin(n) {    // Fanin(n): input node set of n //
3.          s = Fanout(c);          // Fanout(n): output node set of n //
4.          if ((s in C) and (s is not marked))   {
5.              C = C U c;                // c is included in C //
                Controlled Logic Cone(C, c); // call recursively //
6.          }
7.      }
8.  }
```

The foregoing code takes as input an empty set C and a node n as parameters. It inserts in the set C the nodes belonging to the gated logic cone of node n. The algorithm traverses the Boolean network from the node n to the network primary inputs. If, for a node traversed, it holds that all of its outputs are members of set C, then this node is added to set C as well, and the code is recursively called for the nodes' inputs.

In the following logic, n represents the circuit node, Ti is the gating threshold as literal count, Te is the gated threshold as literal count, Ci is the gating cone set and Ce is the gated cone set.

```
1.  Cone_Identification(n, Ti, Te, Gi, Ge)//
        // n : Controlled logic cone node
        //Ti : Gating threshold value
        // Te : Gated threshold value
        // Gi : Boolean Network Gating cones set
        // Ge : Boolean Network Gated cones set
        // Ci : Candidate gating cones set
        // Ce : Candidate gated cones set
2.  {
3.      For all c in Fanin(n) {
4.          Gated_Logic_Cone(C1, c);    // C1:candidate Gated Logic
                                              Cone
5.          C2 = Tran_Fanin(c);          // C2:candidate Gating Logic
                                              Cone
6.          if (((|C1|≧Te) and (no node of C1 is in (Ci U Ce U Gi U Ge))) {
7.              Ce = Ce U C1;
8.          }
9.          else if (((|C2|≦Ti) and (no node of C2 is in Ce U Ge cones)) {
                // If the cone in Tf(c) is below threshold and none of its
                // nodes belong to gated cones
10.             Ci = Ci U C2;
11.         }
12.     }
13.     if (Ce is empty) { // If there are no gated cones return
14.         Ci = empty;
15.     }
16.     else {
17.         if (Ci is empty) {    // If there are no Gating cones
18.             if (|Ce|≧2) { // transform gated cone to a gating one
19.                 CT = min(Ce);
                    // Select cone with maximum power savings if gated
20.                 Ce = Ce - CT;
21.                 Ci = Ci U CT;
22.             }
23.             else {
24.                 C1 = empty;
25.             }
26.         }
27.     }
28.     Gi = Gi U Ci;
29.     Ge = Ge U Ce;
30. }
```

The gating and gated cone logic takes as input a node n, a gating threshold Ti, a gated threshold Te, and two sets, Gi and Ge, denoting the Boolean network gating cones and the Boolean network gated cones sets, respectively. The logic manipulates the gated cone and gating cone starting from each one of the node n's inputs. The gated cone is manipulated as shown in the logic above. The gating cone is the transitive fan-in of the node. If a node is found to belong to a gated cone with cardinality greater than the gated threshold Te, and in addition, none of the cone's nodes are already marked as gating or gated, then the cone is added to the gated cones set, Ce. On the other hand, if that same derived cone possessed transitive fan-in cardinality less than the gating threshold Ti, and none of its constituent nodes are already marked as gated, then the node is added to the gating cones set Ci.

A node belonging to a gating cone evaluates for each input vector in its support set, whereas a node belonging to a gated cone does not, since it depends on its gated counterpart. Therefore, the intersection of the gated and gating cones sets should be empty, i.e. no nodes are allowed to belong to both sets. If the transitive fan-in of all of the node inputs does not identify gated cones, all of the identified gating cones are removed from the gating set. In the case where two or more gated cones have been identified by the algorithm, but no gating cone, one of the gated cones is selected and moved into the gating cone set, even though it may not meet the gating threshold, Ti, requirements. Once the algorithm identifies at least one gating and at least one gated cone for node n, this node becomes a controlled cone and its transitive fan-in is composed of gating and gated parts.

Figure 3:
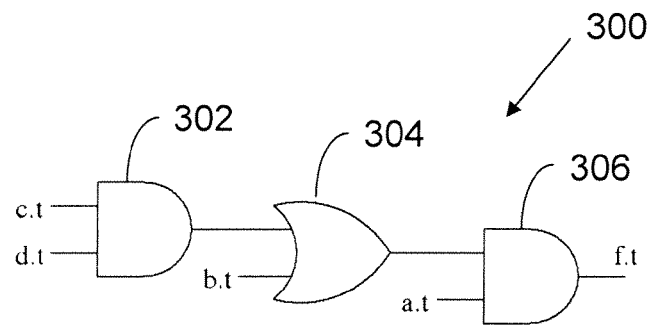
FIG. 3 illustrates an original monotonic dual-rail logic circuit processed in accordance with an embodiment of the invention.
Figure 4:
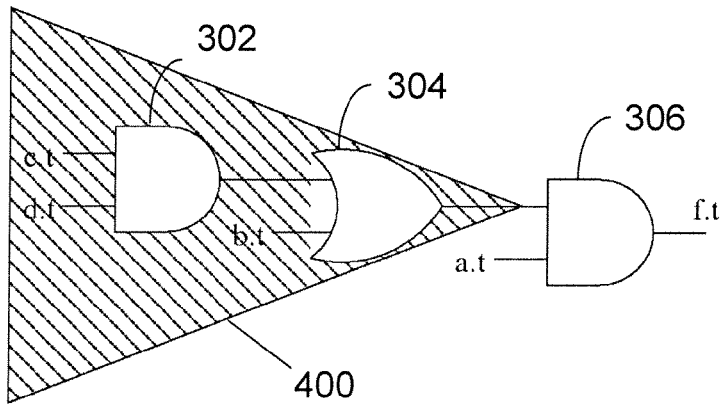
FIG. 4 illustrates a gated cone identified in accordance with an embodiment of the invention.
Figure 5:
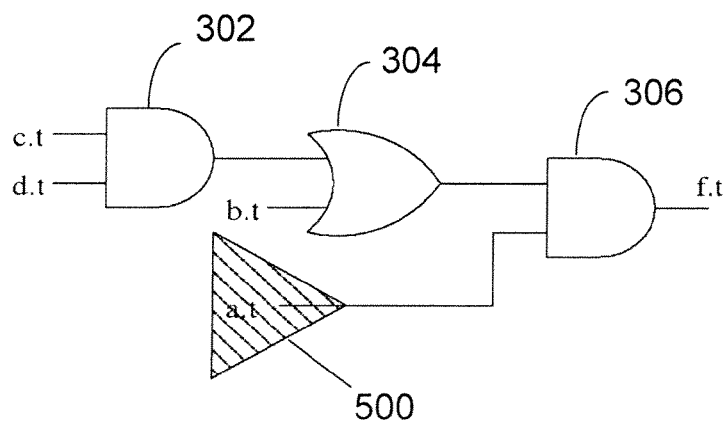
FIG. 5 illustrates a gating cone identified in accordance with an embodiment of the invention.
Figure 6:
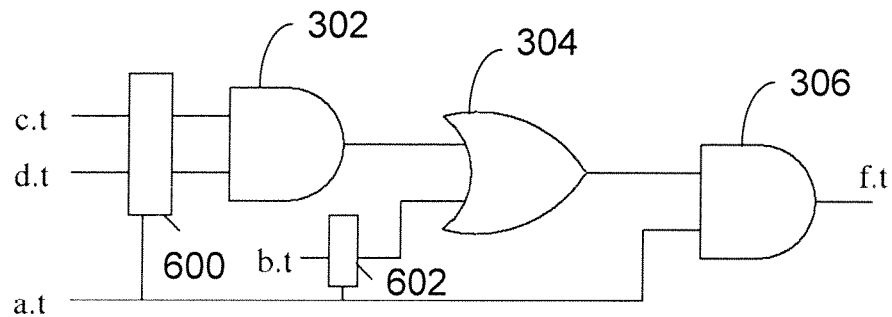
FIG. 6 illustrates latches inserted to the circuit of FIG. 3 to support gated and gating cone operation in accordance with the invention.

The invention is more fully appreciated in connection with some specific examples. FIG. 3 illustrates an original monotonic dual-rail logic circuit 300. The circuit 300 includes logical AND gate 302, logical OR gate 304 and logical AND gate 306. The circuit analyzer and transformer 124, using the criteria set forth above, identifies cone 400 of FIG. 4 as a possible choice for a gated cone. Similarly, the circuit analyzer and transformer 124, using the criteria set forth above, identifies cone 500 of FIG. 5 as a possible choice for a gating cone. As shown in FIG. 6, the circuit analyzer and transformer 124 proceeds to insert latches 600 and 602 in order to segregate the gated sub-circuits from any primary input changes in the case where the signal "a.t" of FIG. 6 is at zero, i.e., the gating condition.

Logic input vector assignments along with the circuit signal transitions for the gated monotonic circuit of FIG. 6 are as follows:

NULL Word Propagation:
a.t=0, b.t=0, c.t=0, d.t=0.
a.t assignment to Logic 0 sets the gating latches to their non-transparent state and the NULL word propagates through the entire circuit. All gates evaluate to Logic 0.
DATA Phase:
For a.t=0, b.t=1, c.t=1, d.t=1, as an input vector, the latches will remain at their non-transparent mode and all gates remain at Logic 0, i.e. NULL. There are no signal transitions and thus no power is consumed for this transition. In contrast, in the original non-gated, monotonic, dual-rail circuit of FIG. 3, two of its gates would switch to Logic 1.
NULL Word Propagation:
a.t=0, b.t=0, c.t=0, d.t=0.
Latches remain at their non-transparent state and all the gates remain at Logic 0. Again, no signals transition, and thus no power is consumed. In contrast, in the original, non-gated, monotonic, dual-rail circuit of FIG. 3, the same two gates would again switch back to Logic 0.
DATA Phase:
a.t=1, b.t=0, c.t=1, d.t=1.
Latches switch to their transparent state. Input signal transitions propagate through the circuit and all the gates evaluate to Logic 1. The non-gated monotonic circuit operates in the same way; however, for this particular vector the extra latch transitions will cost more power for the gated circuit.

Figure 7:
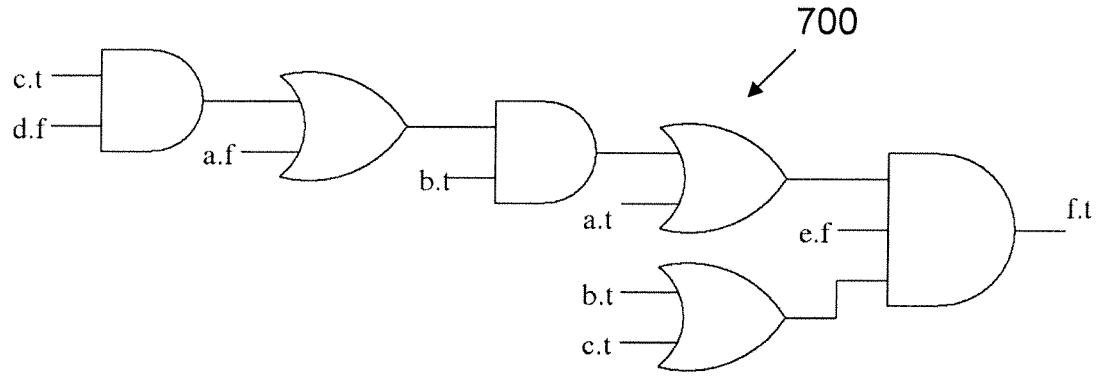
FIG. 7 illustrates an original monotonic dual-rail logic circuit processed in accordance with an embodiment of the invention.
Figure 8:
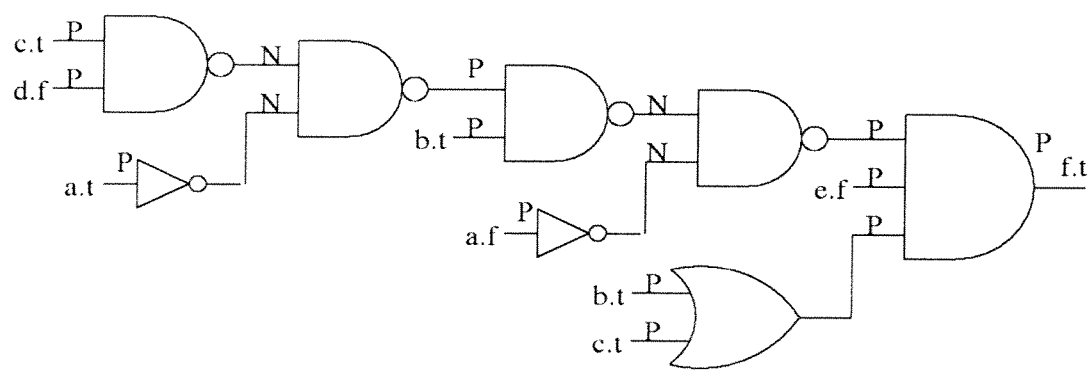
FIG. 8 illustrates positive and negative signal transitions within the circuit of FIG. 7.

FIG. 7 provides another example of an original monotonic dual-rail logic circuit 700. The circuit 700 is processed by the circuit analyzer and transformer 124. In particular, the circuit 700 is technology mapped to library gates indicating signal phases, where P indicates a positive signal phase and N indicates a negative signal phase, as shown in FIG. 8.

Figure 9:
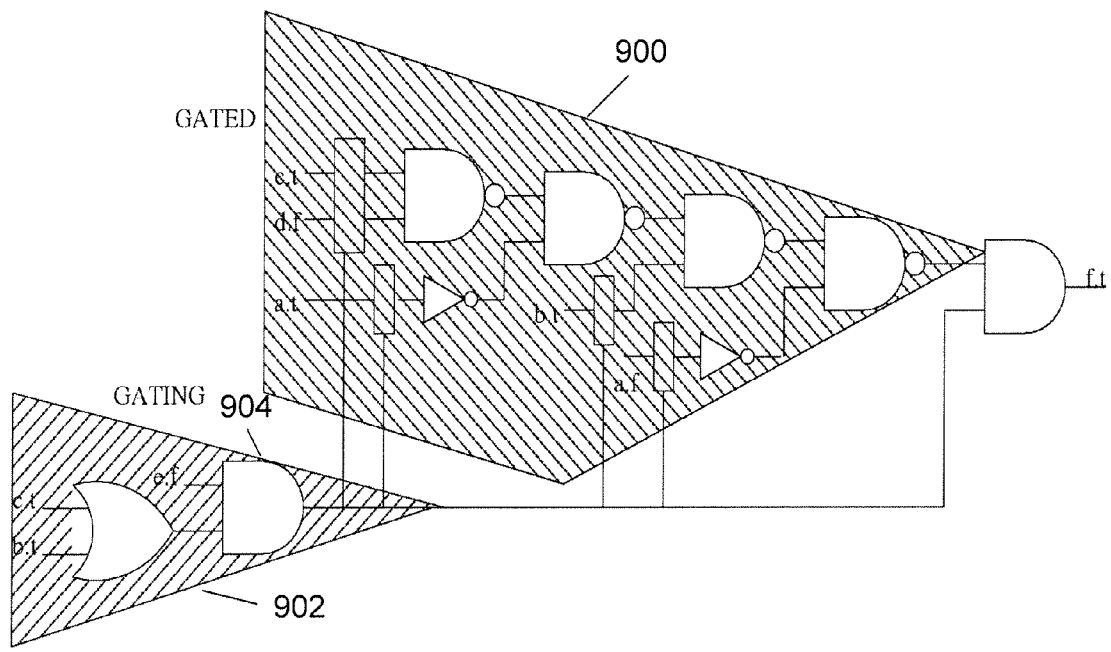
FIG. 9 illustrates gated and gating cones identified in accordance with an embodiment of the invention.
Figure 10:
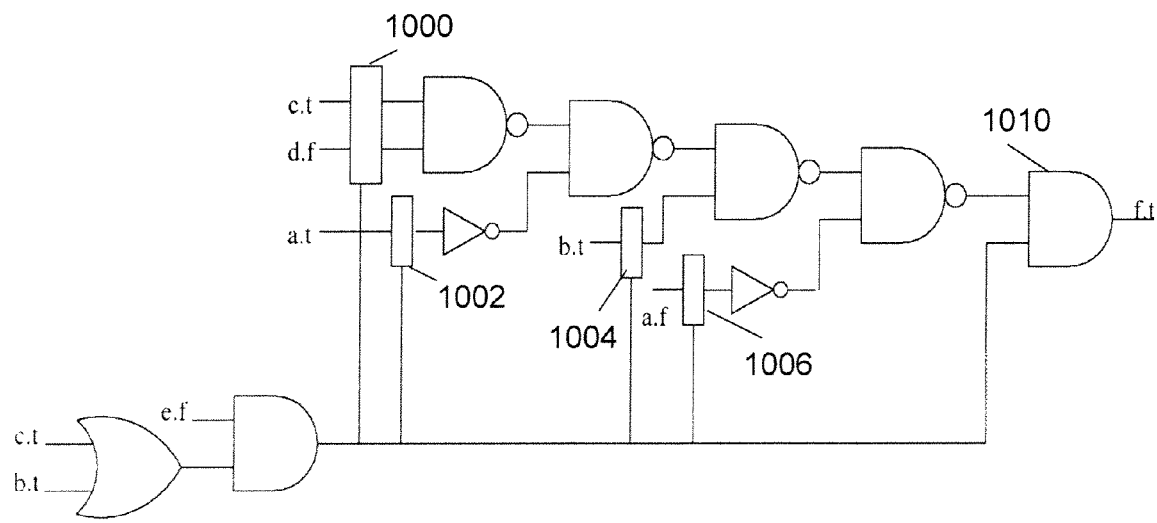
FIG. 10 illustrates latches inserted into the circuit of FIG. 7 to support gated and gating cone operation in accordance with an embodiment of the invention.

The circuit analyzer and transformer 124 proceeds to identify a gated cone 900 and a gating cone 902, as shown in FIG. 9. FIG. 10 illustrates latches 1000, 1002, 1004, and 1006 inserted by the circuit analyzer and transformer 124 to segregate the gated and gating cones.

Observe in FIG. 10 that the top input of the AND gate 1010 produces signal f.t as the output of the gated cone, which includes all the NAND gates and inverters in the drawing. The gating transformation has transformed the three-input AND gate for f.t into a two-input AND for f.t and an extra AND gate for combining the gating signals, e_f and (c_t+b_t). The bottom input of f.t's AND gate 1010 belongs to two gating cones (gating cone 902 of FIG. 9). All of the gates in FIG. 9 constitute a single controlled cone (for a single output).

If, for a controlled cone, multiple gating cones are present, then they can be combined to generate a single gating signal, which will drive all of the enable signals at the latches of the controlled cone. For example, as shown in FIG. 9, the gating cone consisting of the single signal e.f, is combined with the gating cone which consists of the OR gate and the c.t and b.t primary inputs. The combination is performed using an AND gate 904. If any of the two gating cones evaluates to zero, then the gated part will not be evaluated, as the latches are blocking.

Figure 11:
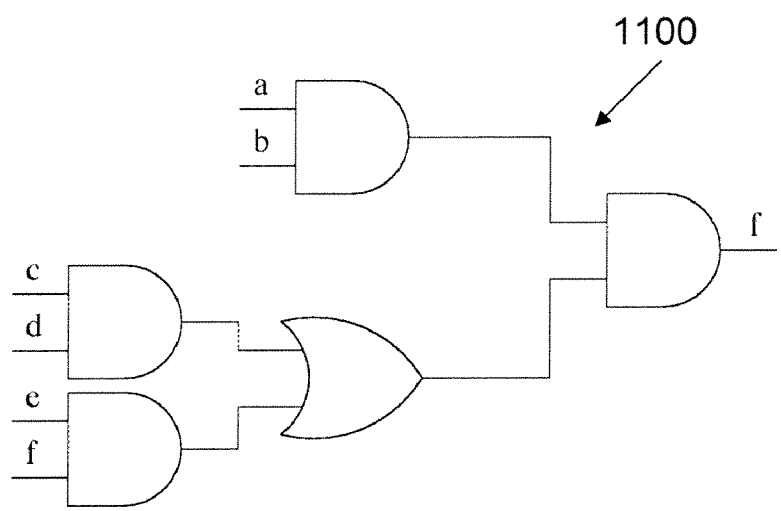
FIG. 11 illustrates the positive portion of a monotonic circuit processed in accordance with an embodiment of the invention.
Figure 12:
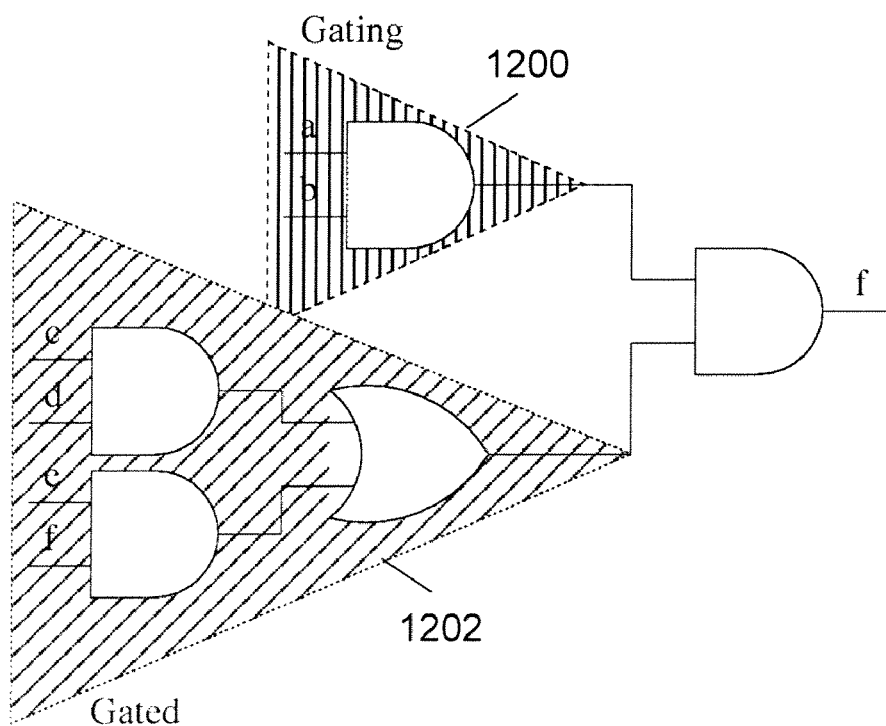
FIG. 12 illustrates gated and gating cones identified in accordance with an embodiment of the invention.
Figure 13:
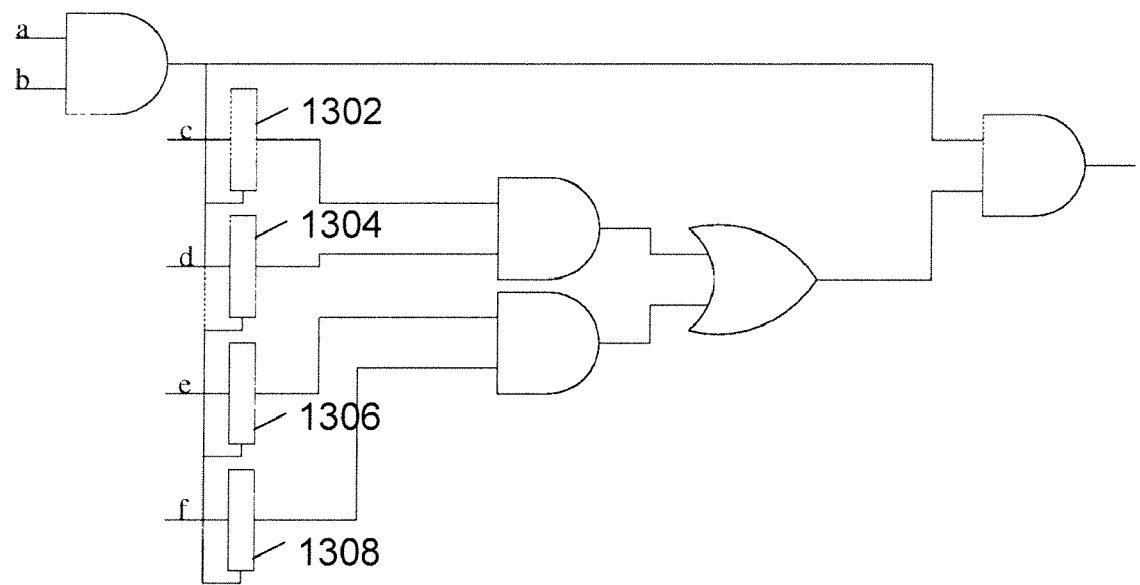
FIG. 13 illustrates latches inserted into the circuit of FIG. 11 to support gated and gating cone operation in accordance with an embodiment of the invention.
Figure 14:
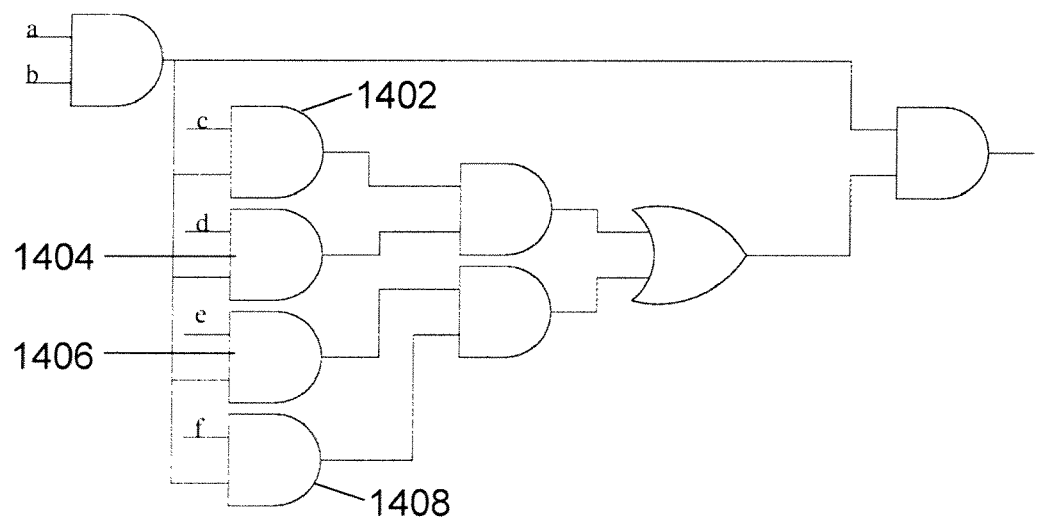
FIG. 14 illustrates gates inserted into the circuit of FIG. 11 to support gated and gating cone operations in accordance with an embodiment of the invention.

FIG. 11 illustrates the positive portion of an original monotonic circuit 1100. Circuit analyzer and transformer 124 identifies a gating cone 1200 and gated cone 1202, as shown in FIG. 12. FIG. 13 illustrates latches 1302, 1304, 1306, and 1308 inserted by the circuit analyzer and transformer 124 to establish a final gated equivalent circuit. Alternately, the circuit analyzer and transformer 124 may use gating and gates instead of gating latches, as shown in FIG. 14. In particular, FIG. 14 illustrates logical gates 1402, 1404, 1406, and 1408 to form a final gated equivalent to the circuit of FIG. 11.

An embodiment of the present invention relates to a computer storage product with a computer-readable medium having computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs, DVDs and holographic devices; magneto-optical media; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention may be implemented using Java, C++, or other object-oriented programming language and development tools. Another embodiment of the invention may be implemented in hardwired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A computer readable storage medium, comprising executable instructions to:
analyze an asynchronous, multi-rail digital circuit to identify a gating sub-circuit and a gated sub-circuit; and
transform the asynchronous, multi-rail digital circuit to segregate the gating sub-circuit and the gated sub-circuit so that the gated sub-circuit operates in a low power state until the gating sub-circuit determines if the gated sub-circuit must be evaluated, thereby reducing power consumption.

2. The computer readable storage medium of claim 1, wherein the executable instructions to analyze include executable instructions to analyze in accordance with area overhead criteria.

3. The computer readable storage medium of claim 1, wherein the executable instructions to analyze include executable instructions to analyze in accordance with the necessity for every controlled function to have at least one gating cone.

4. The computer readable storage medium of claim 1, wherein the executable instructions to analyze include executable instructions to analyze in accordance with the logic depth from primary inputs.

5. The computer readable storage medium of claim 1, wherein the executable instructions to analyze include executable instructions to analyze in accordance with the implementation complexity of a sub-circuit.

6. The computer readable storage medium of claim 1, wherein the executable instructions to analyze include executable instructions to analyze in accordance with criteria to designate a sub-circuit as a gated sub-circuit unless no gating sub-circuit is identified.

7. The computer readable storage medium of claim 1 further comprising executable instructions to segregate the gating sub-circuit and the gated sub-circuit with stateless gates.

8. The computer readable storage medium of claim 7 wherein the stateless gates are latches.

9. The computer readable storage medium of claim 7 wherein the stateless gates are logical gates.

10. A circuit, comprising:
a segregated gating circuit; and
a segregated gated circuit forming an asynchronous, multi-rail digital circuit, wherein the gating circuit operates initially to determine if the output of the gaiting circuit is sufficient to determine a final value, wherein the gated circuit is held in a low power state until the output of the gating circuit fails to determine a final value.

11. The circuit of claim 10 further comprising a controlled sub-circuit responsive to the segregated gating circuit.

12. The circuit of claim 11 wherein the controlled sub-circuit is fully controllable.

13. The circuit of claim 11 wherein the controlled sub-circuit is semi-controllable.

14. The circuit of claim 11 wherein the controlled sub-circuit includes logical AND or logical NOR gates for a monotonically increasing node.

15. The circuit of claim 11 wherein the controlled sub-circuit includes logical NAND or logical OR gates for a monotonically decreasing node.

16. The circuit of claim 10 further comprising a controlled sub-circuit responsive to the segregated gating circuit and the segregated gated circuit.

17. The circuit of claim 10 wherein the segregated gating circuit and the segregated gated circuit are segregated with stateless gates.

18. The circuit of claim 17 wherein the stateless gates are latches.

19. The circuit of claim 17 wherein the stateless gates are logical gates.

* * * * *